United States Patent
Ward (10) Patent No.: US 7,968,154 B2
(45) Date of Patent: *Jun. 28, 2011

(54) ATOMISATION OF A PRECURSOR INTO AN EXCITATION MEDIUM FOR COATING A REMOTE SUBSTRATE

(75) Inventor: Luke John Ward, Durham (GB)

(73) Assignee: P2i Limited (GB)

( * ) Notice: Subject to any disclaimer, the term of this patent is extended or adjusted under 35 U.S.C. 154(b) by 52 days.

This patent is subject to a terminal disclaimer.

(21) Appl. No.: 10/514,661

(22) PCT Filed: May 16, 2003

(86) PCT No.: PCT/GB03/02140
§ 371 (c)(1),
(2), (4) Date: May 20, 2005

(87) PCT Pub. No.: WO03/097245
PCT Pub. Date: Nov. 27, 2003

(65) Prior Publication Data
US 2006/0177598 A1     Aug. 10, 2006

(30) Foreign Application Priority Data
May 17, 2002  (GB) .................................. 0211354.6

(51) Int. Cl.
*H05H 1/24*     (2006.01)
(52) U.S. Cl. ..................................................... 427/569
(58) Field of Classification Search .................. 427/569, 427/248.1
See application file for complete search history.

(56) References Cited

U.S. PATENT DOCUMENTS

| | | | |
|---|---|---|---|
| 4,603,030 A | 7/1986 | McCarthy | |
| 4,629,604 A | 12/1986 | Spector | |
| 4,693,799 A | 9/1987 | Yanagihara et al. | |
| 4,824,690 A * | 4/1989 | Heinecke et al. | 427/577 |
| 4,952,024 A | 8/1990 | Gale | |
| 5,105,761 A | 4/1992 | Charlet et al. | |
| 5,260,105 A * | 11/1993 | Wang | 427/576 |

(Continued)

FOREIGN PATENT DOCUMENTS
EP          0431951          7/1990
(Continued)

OTHER PUBLICATIONS

Bailey, The generation and measurement of aerosols, Journal of Material Science 9, 1974, p. 1344-1362.*

(Continued)

*Primary Examiner* — Timothy H Meeks
*Assistant Examiner* — Elizabeth Burkhart
(74) *Attorney, Agent, or Firm* — Winstead, P.C.

(57) ABSTRACT

The invention relates to a method and apparatus for applying and forming a coating on a substrate surface by the application of at least one atomized coating forming material onto the substrate to form the coating. The atomized coating forming material, upon leaving a suitable atomizer which can be an ultrasonic nozzle or nebulizer for example, passes through an exciting medium and, upon leaving the exciting medium, passes to the substrate. The substrate is positioned remotely from the exciting medium.

22 Claims, 5 Drawing Sheets

U.S. PATENT DOCUMENTS

| | | | |
|---|---|---|---|
| 5,366,770 A | | 11/1994 | Wang |
| 5,412,246 A | * | 5/1995 | Dobuzinsky et al. .......... 257/632 |
| 5,591,409 A | | 1/1997 | Watkins |
| 5,609,921 A | | 3/1997 | Githofer et al. |
| 5,876,753 A | | 3/1999 | Timmons et al. |
| 6,012,647 A | * | 1/2000 | Ruta et al. .................. 239/132.1 |
| 6,146,503 A | | 11/2000 | Sindzingre et al. |
| 6,174,651 B1 | * | 1/2001 | Thakur ...................... 430/272.1 |
| 6,245,396 B1 | | 6/2001 | Nogami |
| 6,287,643 B1 | | 9/2001 | Powell et al. |
| 6,305,314 B1 | | 10/2001 | Sneh et al. |
| 6,402,126 B2 | * | 6/2002 | Vaartstra et al. .............. 261/141 |
| 6,427,623 B2 | * | 8/2002 | Ko ............................ 118/723 E |
| 6,893,978 B1 | * | 5/2005 | Kula ............................. 438/765 |
| 2002/0004104 A1 | | 1/2002 | Timmons et al. |
| 2002/0036358 A1 | | 3/2002 | Watkins |
| 2004/0022945 A1 | * | 2/2004 | Goodwin et al. ......... 427/255.27 |

FOREIGN PATENT DOCUMENTS

| | | |
|---|---|---|
| EP | 0 704 552 A1 | 3/1996 |
| EP | 0896935 A2 | 2/1999 |
| JP | 10250195 | 3/2000 |
| WO | 9858117 A1 | 12/1998 |
| WO | WO 98/58117 * | 12/1998 |
| WO | 9940758 | 8/1999 |
| WO | 0005000 A1 | 2/2000 |
| WO | PCT/US00/12821 | 11/2000 |
| WO | 0228548 | 4/2002 |
| WO | 0228548 A2 | 4/2002 |
| WO | WO 02/28548 * | 4/2002 |
| WO | 03097245 A2 | 11/2003 |

OTHER PUBLICATIONS

Office Action for U.S. Appl. No. 10/516,448 dated May 16, 2005.
Brockhaus et al., "Diagnostics of a Chemically Active, Pulsed Microwave Plasma for Deposition of Quartz-like Films," Contrib. Plasma Phys. 39 (1999) 5, 399-409.
Grill, Alfred, "Cold Plasma in Materials Fabrication: from Fundamentals to Applications," IEEE Press, Apr. 1994.
Kanazawa et al., "Stable Glow Plasma at Atmospheric Pressure," J. Phys. D: Appl. Phys. 21 (1988), 838-840.
Kanazawa et al., "Glow Plasma Treatment at Atmospheric Pressure for Surface Modification and Film Deposition," Nuclear Instruments and Methods in Physics Research B37/38 (1989), 842-845.
Yokoyama et al., "The Improvement of the Atmospheric-Pressure Glow Plasma Method and the Deposition of Organic Films," J. Phys. D: Appl. Phys. 23 (1990), 374-377.
Final Office Action for U.S. Appl. No. 10/516,448 dated Jan. 29, 2010.
Klages, Claus-Peter et al., "Surface Functionalization at Atmospheric Pressure by DBD-Based Pulsed Plasma Polymerization," Plasma and Polymers, vol. 5, No. 2, Nov. 24, 2000, pp. 79-89.
Badyal, J.P.S., "Controlled Plasma Chemical Deposition of Polymeric Coatings," Institution of Electrical Engineers, 1999.
Hynes, A.M., et al., "Pulsed Plasma Polymerization of Perfluorocyclohexane," Macromolecules, vol. 29, No. 12, 1996, pp. 4220-4225.
Hynes, A., et al., "Selective Incorporation of Perfluorinated Phenyl Rings During Pulsed Plasma Polymerization of Perfluoroallybenzene," Chem.Mater., vol. 10, No. 8, 1998, pp. 2177-2182.
Office Action from U.S. Appl. No. 10/516,448 dated Oct. 7, 2010.

* cited by examiner

ATOMISATION OF A PRECURSOR INTO AN EXCITATION MEDIUM FOR COATING A REMOTE SUBSTRATE

CROSS-REFERENCE TO RELATED APPLICATIONS

This application is a National Phase of International Application No. PCT/GB2003/002140 filed on May 16, 2003, which claims priority to GB 0211354.6 filed on May 17, 2002.

BACKGROUND OF THE INVENTION

The invention to which this application relates is to the application of a coating to a substrate involving the improved utilisation of an exciting medium.

The use of excitation mediums is known in the application of coatings. However, deleterious effects of high energy species can be present within the "exciting medium", such as bombarding ions and UV photons. This can prevent the coating of sensitive substrates with films that retain a significant degree of monomer functionality and can also cause ion etching effects.

The exciting medium tends to be the medium in which, conventionally, the substrate to be coated is positioned. The exciting medium can be generated in a number of ways, the most common of which is the generation of a plasma, with the area over which the plasma is said to extend typically defined by a plasma glow typically lying within the area defined by the electrodes used to generate the plasma. The positioning of the plasma within the exciting medium is typically referred to as direct PECVD as defined in the book "Cold Plasma in Materials Fabrication—Alfred Grill—IEEE Press 1993". The same book also described the provision of remote PECVD, in which the substrate to be coated is removed from the exciting medium. However in both cases the coating is achieved through the introduction of gaseous materials and this slows the deposition rate significantly and renders the same commercially unviable for many applications.

It is also known from earlier patents such as U.S. Pat. No. 5,451,260 and WO9810116 that the substrate can be positioned in the same CVD reactor as a nozzle for introducing material for the coating process but neither patent acknowledges the possible use of atmospheric-pressure plasmas, pulsed plasmas and continuous processing.

The patent application WO 0228548 describes a direct PECVD process, wherein in the examples of the invention, the sample to be coated is placed within the plasma and hence the exciting medium formed from atomised coating forming material. In addition the patent application does not mention low-pressure or pulsed plasmas or other types of remote plasma and the possibility of non-ionised or non-plasma excitation sources (such as ozone, radicals, UV irradiation or heat). Furthermore in this patent application the nozzle for introducing the coating material is positioned at the plasma region to introduce the material within the plasma and directly impinges upon the substrate.

Patent application WO 0070117 does not use an atomiser but does use plasmas (high and low pressure) to deposit coatings on a remote substrate. However, the pressure range specified in Claim 15 (10-1000 Torr) is 10 to 100 times higher than that normally used for low-pressure glow discharge deposition, no alternative means of excitation are mentioned and no specific examples of polymeric coatings and their uses are cited.

The aim of the present invention is therefore to provide a means of using an atomiser to inject a liquid or liquid/solid slurry into an exciting medium to allow rapid deposition, even from involatile monomers onto substrates or a substrate to be coated with improved deposition rates and coating quality so as to render the same commercially viable.

SUMMARY OF THE INVENTION

In a first aspect of the invention there is provided a method for depositing a coating, said method comprising the steps of; introducing an atomised coating forming material into an exciting medium, said atomised coating forming material passing through the excitation medium and depositing the activated atomised coating forming material onto a substrate, characterised in that said substrate is positioned remotely from the exciting medium.

Typically said substrate is substantially unaffected by the exciting medium.

This method avoids excessive damage to the substrate or coating applied thereto from occurring.

Preferably the substrate is sufficiently remote from the exciting medium such that the exciting medium has no or minimal effect on the coating applied or the substrate itself. It should be appreciated that the degree of remoteness can be selected in accordance with operating conditions and that while there may still be some deleterious effect from the exciting medium the purpose and achievement of the invention is to ensure that such effect is minimised so as to be negligible.

In one embodiment the substrate is remote from the exciting medium in that it is physically spaced from the exciting medium by a selected distance and/or a physical obstacle such as a baffle or bend in a connecting passage is provided and/or a device is provided to remove undesirable, damaging species from the exciting medium and prevent the same from reaching the substrate. In one embodiment such a device is an electrically biased or earthed grid positioned between the exciting medium and the sample.

In one embodiment, additional materials are added to the flow of atomised coating forming material at, prior to, or subsequent to, the exciting medium.

Preferably said additive materials act as buffers required to maintain process pressure and/or carry the atomised coating forming material through the exciting medium to the substrate.

In one embodiment the additive materials have the additional capacity to modify and/or be incorporated into the coating forming material and/or the resultant coating.

In one embodiment, in order to produce a substrate possessing a multi-layered coating, the introduction of species additional to the atomised coating forming material is pulsed.

Typically the exciting medium is a plasma discharge

In one embodiment the plasma is operated at atmospheric, sub-atmospheric or low-pressure and can be produced by audio-frequencies, radio-frequencies, microwave-frequencies, or direct current voltage.

In one embodiment the plasma discharge is generated by an alternating current voltage.

In one embodiment the exciting medium comprises species generated by a remote plasma. Plasmas suitable for such a purpose include, but are not limited to, atmospheric, sub-atmospheric or low pressure discharges generated by low frequency, radio-frequency or microwave-frequency power supplies and hollow cathode devices.

In one embodiment the exciting medium is created by a flux of electromagnetic radiation such as UV light or y-radiation, or alternatively, a flux of ionised particles such as ions, electrons or a-radiation, or yet further by a flux of radicals. In a further embodiment, the exciting medium is generated by a source of highly reactive species such as ozone.

In a yet further embodiment the exciting medium is created by the interposition of a heat source, such as a heated grid or heat lamp, between the source of atomised coating forming material and the substrate.

In one embodiment the exciting medium is generated by more than one of the excitation means, whether singly in succession, in simultaneous combination, or in a succession of combinations.

In one embodiment the exciting medium is applied continuously.

In an alternative embodiment the exciting medium is pulsed. Suitable means of achieving this include, but are not limited to, electronically pulsing the means of generating the exciting medium (for example, the plasma power supply) or using a shutter to modulate the flux of incident excited species (photons, remote plasma species). The operation of a shutter may be mechanical or otherwise. For example a suitably modulated, electrically biased grid may act as a shutter for the exclusion of charged particles. The pulsing of the exciting medium can result in a coating that significantly retains the chemical properties of the atomised coating forming material.

Thus in a further aspect of the invention there is provided a method of producing a multi-layered coating wherein the substrate is repeatedly exposed to excited coating forming material as herein described, in stages. In one embodiment the type or composition of the coating forming material introduced is altered between coating stages.

In a further aspect of the invention there is provided a method of producing a multi-layered or graduated coating upon a substrate wherein the composition of the precursor and/or the nature of the exciting medium are changed during the production of the coating.

In one embodiment the substrate is coated continuously by use of a reel-to-reel apparatus. In one embodiment the substrates is moved past and through coating apparatus acting in accordance with this invention.

In whichever embodiment, the coating formed on the substrate can be post-treated by exposure to an exciting medium.

In whichever embodiment the substrate onto which the coating is formed can be cooled, treated or kept at ambient temperature.

In whichever embodiment the substrate can be pre-treated by exposure to an exciting medium prior to coating.

The substrate can comprise, but is not limited to, metal, glass, semiconductor, ceramic, polymer, fabrics, woven or non-woven fibres, natural fibres, synthetic fibres, cellulosic material, and/or powder.

The coating forming material may constitute, but is not limited to, an organic, organosilicon, organometallic, or inorganic material, or mixtures or combinations of the same.

The coating formed can be such as to improve the hydrophobic and/or oleophobic, adhesive, gas barrier, moisture barrier, release, electrical and thermal conductivity, dielectric, optical, biomedical, biotechnological and tribological properties of the substrate.

In one embodiment the coating material introduction means is an atomiser. In one embodiment the atomiser is an ultrasonic nozzle supplied with coating forming material in the form of a liquid or liquid/solid slurry. In another embodiment the atomiser is a nebulizer supplied with coating forming material in the form of a liquid or liquid/solid slurry, and a carrier gas which may be inert or reactive. Yet further the atomiser can be a plain-jet gas blast atomiser supplied with coating forming material in the form of a powder, and a carrier gas which may be inert or reactive.

Typically more than one atomiser is used to supply coating forming material to the energetic medium.

If required, the excitation medium and surrounding apparatus are heated.

The method can, in whichever embodiment, result in a coated substrate which is subject to subsequent derivatization by methods known in the art (e.g. tethering of biomolecules).

In a further aspect of the invention there is provided a method for depositing a coating, comprising a source of atomised or nebulized coating forming material (such as an organic or organo-silicon monomer or oligomer) which is introduced into an exciting medium that facilitates the formation of activated precursor species to the coating (such as monomer radicals, ions or oligomers), which precursor species are subsequently deposited onto a substrate, situated outside of the exciting medium, forming the coating.

The remote placement of the substrate prevents the high energy species that constitute the exciting medium from causing excessive damage to the substrate and the growing coating.

In a preferred embodiment of the method, the coating forming material, either a liquid or a solid/liquid slurry, is atomised by an ultrasonic nozzle into an excitation zone and heated to prevent condensation. Other means of atomising the coating forming material include, but are not limited to, nebulizers and plain-jet air blast atomizers.

The exciting medium may comprise the atomised coating forming material in the absence of other materials or mixed with, for example, an inert or reactive gas. The additional material may be introduced continuously or in a pulsed manner by way of, for example, a gas pulsing valve.

In all cases the means of activating the coating forming material prior to deposition would damage the substrate and/or growing film if applied directly.

A means of isolating the substrate from the deleterious effects of direct exposure to the exciting medium is provided to ensure that the distance between the excitation medium and the substrate is sufficient to largely preclude damaging phenomena (usually ion bombardment). Another means of achieving this separation is to interpose a physical impediment, such as a baffle or bend, between the excitation medium and the substrate. Alternatively, a device that selectively removes undesirable, damaging species may be used. An example of such a device is an electrically biased or earthed grid between the exciting medium and the sample.

Multi-layer coatings can be produced by a variety of means; namely, pulsing the atomisation source, pulsing the introduction of reactive, additive species to the excitation medium (e.g. intermittently adding oxygen to a plasma); pulsing the excitation medium (e.g. alternating between continuous and pulsed plasma to produce alternating cross-linked and well-retained layers); changing the nature of the excitation medium (e.g. from plasma to UV); changing the composition of the coating forming material, and performing multiple treatments (with one or more apparatuses).

In a further aspect of the invention there is provided a method of applying a coating to a substrate, said method comprising the steps of introducing into a vacuum chamber an atomised coating material, directing the coating material introduction towards and through an exciting medium to excite the coating material, and characterised in that the substrate to be coated is positioned with respect to the exciting medium and means for introducing the coating material such that the coating material leaves the exciting medium and continues a distance after leaving the same to apply to the substrate to form the coating thereon.

In a preferred embodiment the means for generating the exciting medium is controlled to ensure that the exciting medium does not extend to the substrate so as to have any significant effect thereon.

In a yet further aspect of the invention there is provided apparatus for the formation of a coating on a substrate, said apparatus comprising a vacuum chamber, means for holding the substrate in the said chamber, means for introducing a coating material into the chamber, and means for generating an exciting medium within said chamber and characterised in that the means for introducing the coating material is positioned to be at a first side of the exciting medium when generated in the chamber and the substrate is positioned to be at the opposing side of the said exciting medium and remote therefrom such that the directed atomised coating material passes through the exciting medium and, upon leaving the same, passes to the substrate to form the coating thereon.

In one embodiment the means for generating the exciting medium is spaced from the location of the exciting medium within the chamber.

In one embodiment the substrate is moved through the vacuum chamber in an in line manner.

In one embodiment the apparatus can be provided as part of a purpose built machine or alternatively, some or all of the components of the apparatus can be provided in a modular form to allow the same to be retrofitted to existing coating apparatus in the required configuration.

Typically the means for introducing the atomised coating material is connected to a supply of the coating material so as to allow the continuous and monitored supply of the coating material in the atomised form and with sufficient velocity to ensure that the material reaches the substrate to form the coating thereon.

Typically the velocity of the atomised coating material can be controlled by varying the system pumping speed or gas flow rate to ensure that the material reaches the substrate to form a coating thereon.

Typically control means are provided for the coating material introduction means, exciting medium generating means and position of the substrate to ensure that the same are adjusted and set to suit particular operating conditions and to remove or minimise any effect of the exciting medium on the substrate.

BRIEF DESCRIPTION OF THE DRAWINGS

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

The invention may take physical form in certain parts and arrangement of parts. For a more complete understanding of the present invention, and the advantages thereof, reference is now made to the following descriptions taken in conjunction with the accompanying drawings. Specific examples of the invention are now described with reference to the accompanying drawings wherein.

DETAILED DESCRIPTION OF THE INVENTION

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

Figure 1A:
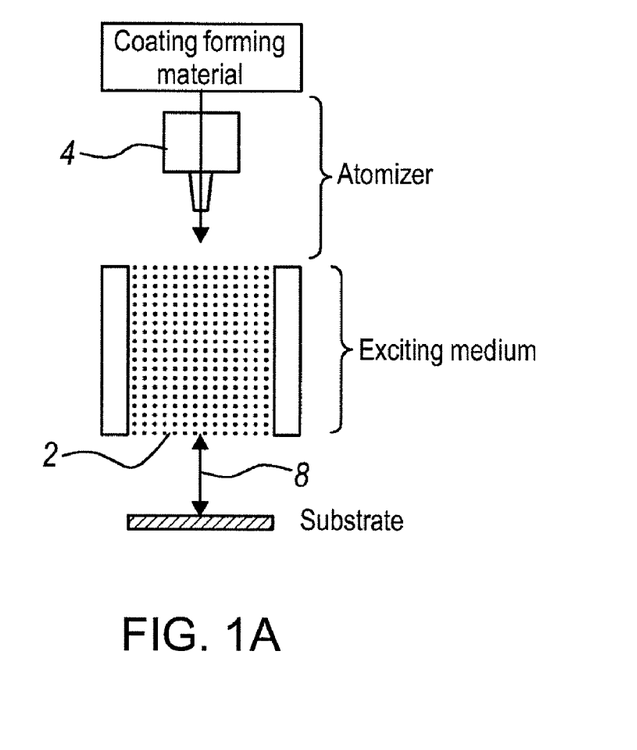
FIGS. 1a and b illustrate a plasma discharge ignited and a source of atomised coating forming material.
Figure 1B:
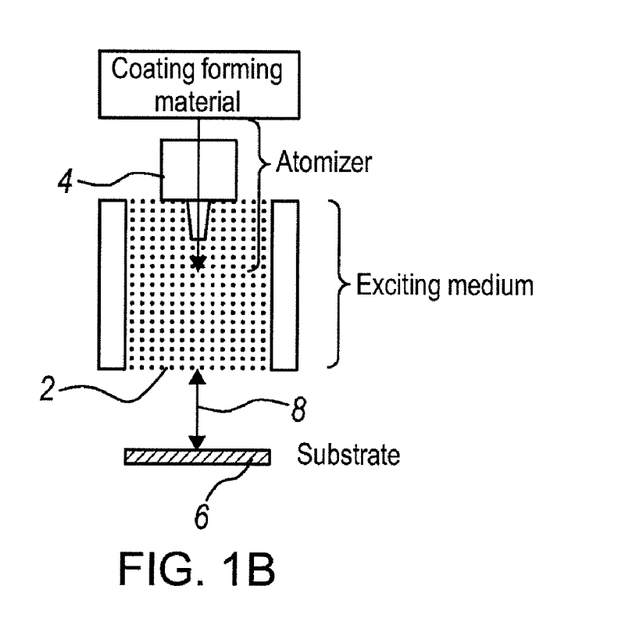
Figure 2:
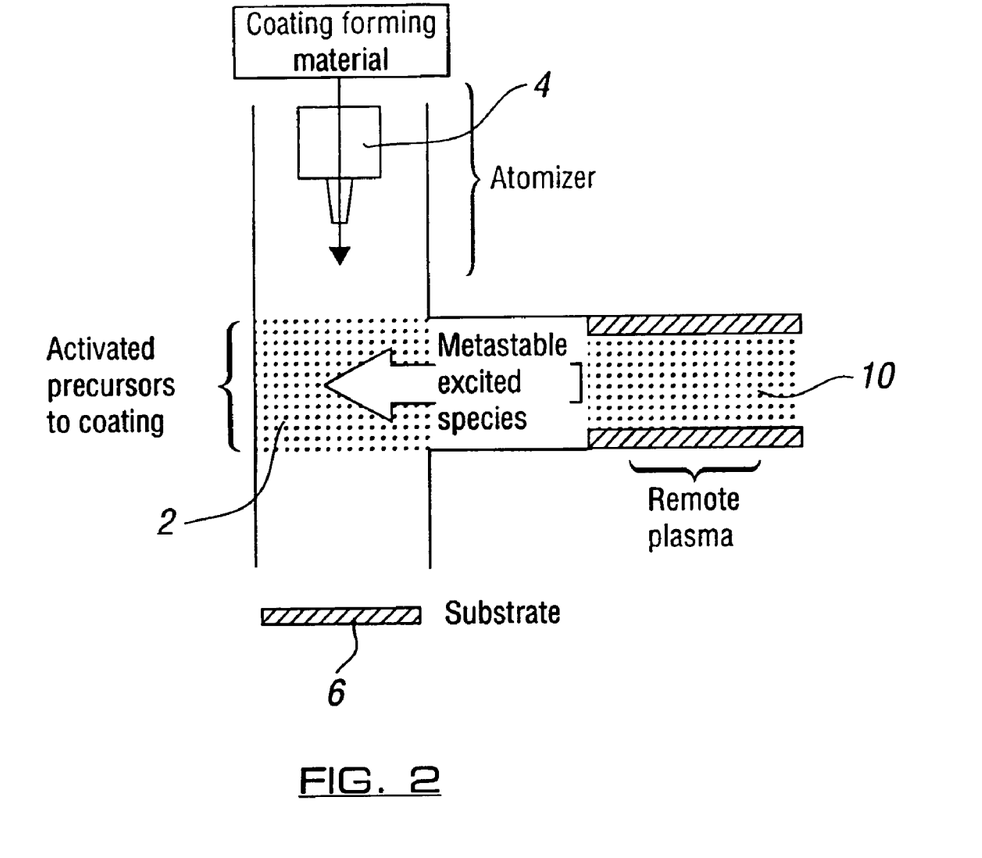
FIG. 2 illustrates a further embodiment of exciting the atomised coating forming material in accordance with one embodiment of the invention.

With reference to FIGS. 1a and b, the exciting medium 2, in a preferred embodiment, constitutes a plasma discharge ignited in a region surrounding, as in FIG. 1a, or in a region downstream, as in FIG. 1b, the source 4 of atomised coating forming material. The substrate 6 with the surface to be coated is positioned so as to be remote, in this case by the provision of the physical separation by distance 8, from the location of the exciting medium 2.

Suitable plasmas for use in the generation of the exciting medium 2 include non-equilibrium plasmas such as those generated by audio frequencies, radio frequencies (RF), microwaves or direct current. The plasma can be generated at low-pressure, atmospheric or sub-atmospheric pressures as are known in the art. Of special utility are low-pressure radiofrequency plasmas wherein the gas pressure is 0.01 to 10 mbar and atmospheric-pressure-glow-discharges (APGDs) which typically utilise a high flux of carrier gas (usually helium or argon) and a high frequency power supply (1 kHz to RF).

The plasma can be applied in a continuous or pulsed fashion with the use of pulsed plasmas possibly leading to the yielding of coatings with a greater functional integrity.

An alternative embodiment for providing the exciting medium to excite the atomised coating forming material prior to deposition is to provide a remote plasma 10 as shown in FIG. 2. Species extracted from almost any plasma, including low pressure RF and MW discharges, hollow cathode devices and APGDs, can be used to activate and excite the coating forming material prior to deposition of the same onto the substrate 6.

Other means of creating the reactive precursors to coating deposition include, but are not limited to UV/VUV irradiation, electron beam treatment, y-irradiation, heating (with a grid or lamp) and/or exposure to reactive ground-state species such as ozone (itself for example generated by a remote plasma or UV irradiation). As with plasmas, the above means of excitation may be continuous or pulsed.

One means for providing a pulsed supply is to use a rotating shutter, although a grid possessing a modulated electrical bias would be capable of intermittently preventing the transit of appropriately charged species.

The following examples illustrate the present invention but are not intended to limit the same.

EXAMPLE 1

Figure 3:
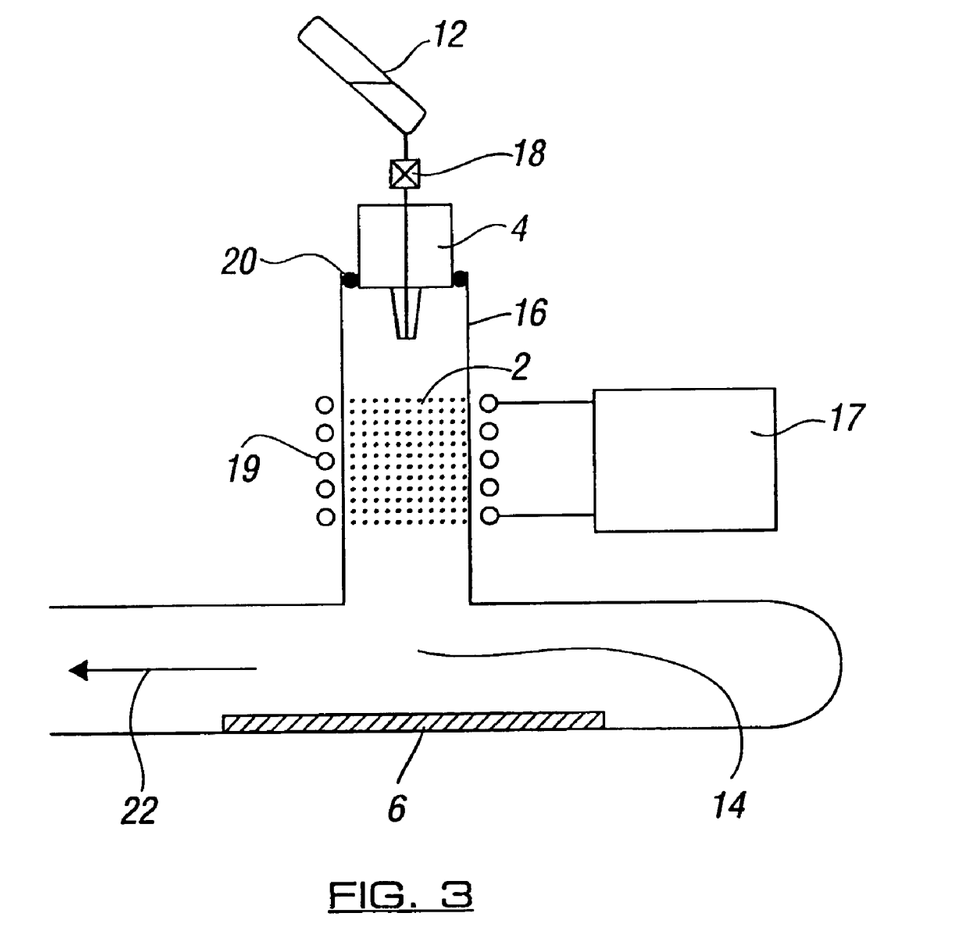
FIG. 3 shows a diagram of an apparatus that uses a radiofrequency plasma to generate the exciting medium and effect the deposition of an atomised coating forming material.

Deposition of Hydrophobic/oleophobic Films 1H, 1H, 2H, 2H perfluorooctylacrylate is placed into a monomer 12 tube having been purified using repeated freeze-pump-thaw cycles. Coating deposition experiments are performed in an apparatus consisting of an ultrasonic atomisation nozzle 4 connected to a glass vessel 16, itself comprising a radiofrequency plasma excitation generating means 17 and exciting medium volume 2, and a downstream deposition region 14 containing the substrate 6 as shown in FIG. 3. The monomer tube is connected to the ultrasonic nozzle by way of a metering valve 18. The ultrasonic nozzle is itself connected to the glass vessel by way of "nitrile" O-rings 20.

A "Pirani" pressure gauge is connected by way of a Young's tap to the glass reactor vessel. A further Young's tap is connected with the external, ambient air supply and a third leads to an Edwards E2M2 two stage rotary pump by way of a liquid nitrogen cold trap 22. All connections are grease free.

The exciting medium generating means 16 comprise an L-C matching unit and a power meter are used to couple the output from a 13.56 MHz RF generator to a copper coil 19 wound around the wall of the plasma exciting medium volume 2. This arrangement minimises the standing wave ratio (SWR) of the power transmitted from the RF generator to the partially ionised gas in the plasma excitation volume.

Prior to the deposition of the coating forming material the reactor vessel is soaked overnight in a nitric acid bath, scrubbed with detergent, rinsed with propan-2-ol and oven dried. The ultrasonic nozzle, metering valve and related fittings are rinsed with propan-2-ol and air-dried. The reactor vessel, monomer tube, ultrasonic nozzle, metering valve and related fittings are then incorporated into the assembly shown in FIG. 3. Next the substrate to be coated is placed into the deposition region 14, downstream of the plasma excitation volume, and the apparatus evacuated to base pressure ($7 \times 10^{-3}$ Torr).

The metering valve is then opened until the liquid monomer flows into the ultrasonic nozzle at a rate of $8 \times 10^{-4}$ ml s$^{-1}$. Switching on the ultrasonic generator (3.0 W) initiates atomisation of the coating forming material, resulting in an increase in the chamber pressure to 0.4 Torr. The plasma is then ignited and the RF power maintained at 2 W, at which value the plasma is observed to be localised within the exciting medium volume 2 defined by the location of the coils 19. Typically a 0-10 minute deposition duration is used, and found to be sufficient to give complete coating coverage of the substrate 6. After this, the metering valve is closed, the RF and ultrasonic generators switched off, and the apparatus evacuated back down to base pressure before finally venting to atmospheric pressure.

A spectrophotometer (Aquila Instruments nkd-6000) was used to determine the thickness of the coatings. Contact angle measurements were made with a video capture apparatus (AST Products VCA2500XE) using sessile 2 uL droplets of deionised water and n-decane as probe liquids for hydrophobicity and oleophobicity respectively.

The results of 10 minutes of deposition onto silicon wafers in accordance with the method of this example are shown in Table 1

TABLE 1

| Coating Forming Material | Deposition Duration/ min | Film Thickness/ nm | Contact Angle/° Water | Decane |
|---|---|---|---|---|
| 1H, 1H, 2H, 2H perfluorooctylacrylate | 10 | 629 ± 55 | 124 ± 2 | 73 ± 2 |

In Table 1 it can be seen that the method of the invention enables the rapid deposition of relatively thick films from a monomer possessing low volatility. The water contact angle results confirm that the films are hydrophobic and the decane contact angles are indicative of a good degree of oleophobicity.

EXAMPLE 2

Deposition of a Hydrophilic Coating

In a second illustrative example, the method and apparatus of Example 1 and as illustrated in FIG. 3 are repeated using 2-hydroxyethyl methacrylate as the coating forming material.

The hydrophilicity of the deposited coatings are assessed by water contact angle measurements with a video capture apparatus (AST Products VCA2500XE) using sessile 2 uL droplets of deionised water. Information on the chemical groups present within the films was obtained using FT-IR (Perkin Elmer, Spectrum One).

The water contact angle of coatings deposited onto polished silicon wafers was 28±2°, confirming that they are indeed hydrophilic.

Figure 4:
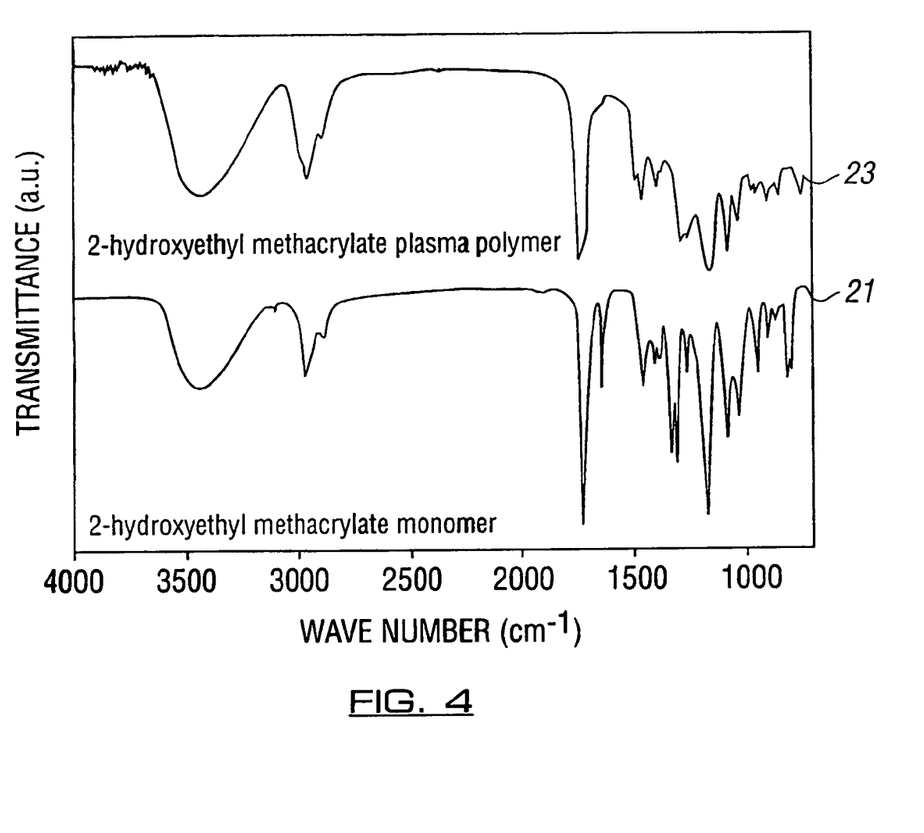
FIG. 4 is a graph showing the infrared absorption spectrum of 2 hydroxyethyl methacrylate polymerised using the method of the invention.

FIG. 4 compares the infrared spectrum of the starting material, 21 with that of a film deposited onto a polished silicon wafer 23. Absorption bands indicative of the carbon-carbon double bond in the monomer are absent in the coating. In contrast, the sought hydroxyl group is shown to be present in both. These results verify that the coating is a well-defined polymer of 2-hydroxyethyl methacrylate, retaining much of that monomer's functionality and utility.

EXAMPLE 3

Deposition Using a Remote Microwave Frequency Excitation Source

Figure 5:
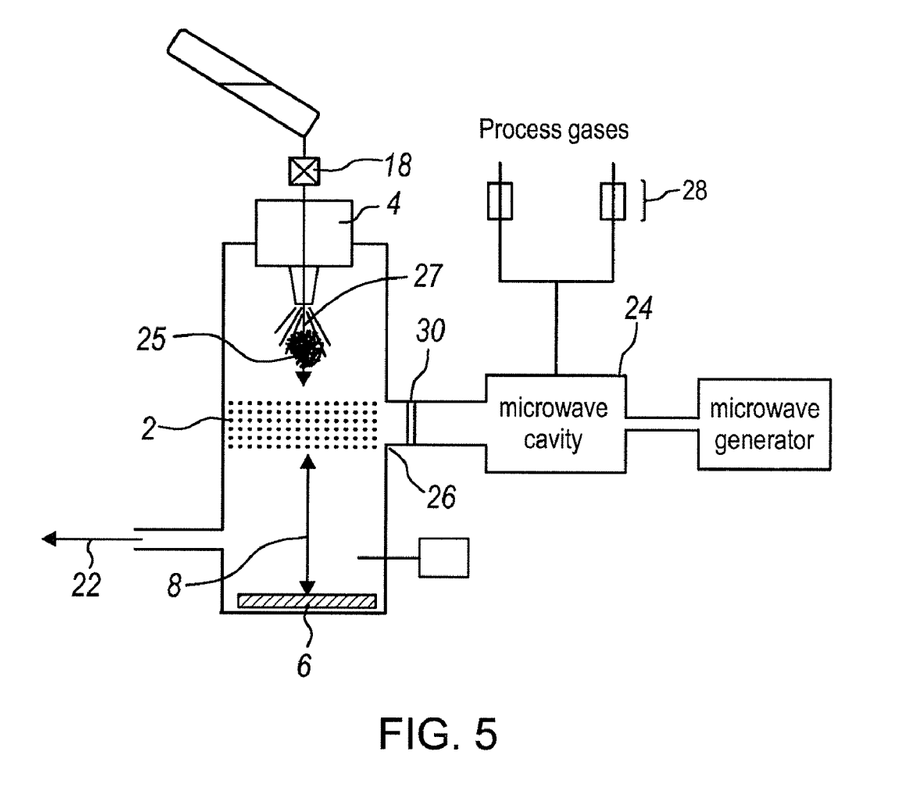
FIG. 5 shows a diagram of an apparatus that uses a remote microwave frequency plasma to effect deposition of an atomised coating forming material in a further embodiment of the invention.

In a third illustrative example of the method, described with reference to FIG. 5, coatings are deposited using an apparatus consisting of an ultrasonic atomising nozzle 4 and a remote microwave plasma source 24 for generating the exciting medium 2. Activation of the coating forming material 25 is achieved by directing its atomised spray as indicated by arrow 27 into the output of the remote microwave plasma, that being the exciting medium 2. The activated coating precursor species are then allowed to deposit onto the substrate 6 remote from the exciting medium. The substrate is disposed in a manner that precludes the direct exposure to species incident from the plasma as shown in FIG. 5 in this case by means of the distance 8 and the bend 26.

The apparatus is temperature controlled (20-150° C.) and evacuated using an E2M28 two stage Edwards rotary pump by way of a liquid nitrogen cold trap 22.

The remote microwave source 24 consists of a quartz cavity connected to the output of a 2.45 GHz microwave generator by way of a wave-guide. The open end of the cavity faces into the excitation medium 2 downstream of the ultrasonic nozzle. Process gases are introduced into the cavity in combinations regulated using mass flow controllers 28. A constant reaction pressure is maintained by throttling the rotary pump with a butterfly valve. By interposing a quartz plate 30 between the microwave cavity and the atomised spray it is also possible to deposit coatings using only the VUV and UV emission from the plasma to activate the coating forming material.

Treatment comprises first placing the sample inside the apparatus in a suitable location, away from the deleterious effects of direct exposure to the remote plasma. The apparatus vacuum chamber is then evacuated to base pressure ($4 \times 10^{-3}$ Torr) before purging with the chosen process gas (or combination of gases) to the selected pressure and allowing the chamber to attain the correct temperature. The coating forming material, purified if necessary with repeated freeze-pump-thaw cycles, is then introduced into the atomising nozzle by way of a metering valve 18. Igniting the remote microwave plasma then enables the production of the activated coating forming material in the exciting medium 2 and its subsequent deposition onto the substrate 6 located further downstream. Following deposition the microwave generator and ultrasonic nozzle are switched off, the monomer supply and process gas flows stopped and the chamber evacuated and vented prior to substrate removal.

A spectrophotometer (Aquila Instruments nkd-6000) was used to determine the thickness of the coatings. The elemental composition and limited chemical information were obtained using X-ray photoelectron spectroscopy (XPS).

The differences from the prior art of the use of an atomiser, which can be any of an ultrasonic nozzle, nebulizer or gas jet blast to inject the liquid or liquid/solid slurry into the exciting medium and the positioning of the substrate to be remote from the exciting medium within the vacuum chamber have provided clearly advantageous coatings. The resultant high flux of coating forming material permits the rapid deposition of coating material, even from involatile monomers and with the substrate maintained significantly remote from the exciting medium (typically a plasma) and allows coatings to be formed with specific characteristics, such as liquid resistance or permeability at a rate which is significantly increased and increased to such an extent as to render the method and apparatus significantly commercially usable and viable.

The invention claimed is:

1. A method for depositing a coating, said method comprising the steps of:
   introducing an atomised liquid coating forming material into an exciting medium in a vacuum chamber;
   said exciting medium is a plasma discharge and/or species generated by a plasma;
   said atomised coating forming material passing through the excitation medium;
   positioning a substrate in said vacuum chamber remotely from the exciting medium and means for generating the exciting medium so that the substrate and coating material applied thereto are substantially unaffected by the exciting medium and means for generating the exciting medium; and
   wherein said atomised coating forming material in the form of atomized liquid droplets is activated by the exciting medium to form chemically activated precursor species including any or any combination of monomer radicals, ions or oligomers to the coating, prior to leaving the exciting medium; and
   wherein after leaving said exciting medium said activated precursor species are subsequently deposited onto said substrate in a vacuum to form the coating.

2. A method according to claim 1 wherein the substrate is remote from the exciting medium in that a device removes species from the exciting medium to prevent the same from reaching the substrate.

3. A method according to claim 2 wherein the device is an electrically biased or earthed grid positioned between the exciting medium and the substrate.

4. A method according to claim 1 wherein additional materials are added to the flow of atomised coating forming material at, prior to, or subsequent to, the same passing through the exciting medium.

5. A method according to claim 4 wherein said material acts as a buffer to maintain process pressure and/or carry the atomised coating forming material through the exciting medium to the substrate.

6. A method according to claim 4 wherein the additive materials have the additional capacity to modify and/or be incorporated into the atomised coating forming material and/or the resultant coating.

7. A method according to any one of claims 4-6 wherein to produce a multi-layered coating, the introduction of the additional material to the atomised coating forming material is pulsed.

8. A method according to claim 1 wherein the exciting medium is created by a flux of electromagnetic radiation, ionised particles or radicals.

9. A method according to claim 1 wherein the exciting medium is generated by a source of highly reactive species such as ozone.

10. A method according to claim 1 wherein the exciting medium is pulsed.

11. A method according to claim 1 wherein the coating formed on the substrate is post-treated by exposure to an exciting medium.

12. A method according to claim 1 wherein the substrate is pre-treated by exposure to an exciting medium prior to coating.

13. A method according to claim 1 wherein the atomised coating forming material constitutes any or any combination of an organic, organosilicon, organometallic, or inorganic material.

14. A method according to claim 1 wherein the atomised coating forming material is applied through an atomiser.

15. A method according to claim 14 wherein the atomiser is an ultrasonic nozzle with a supply of material to the atomiser is as a liquid or liquid/solid slurry.

16. A method according to claim 14 wherein the atomiser used is a nebulizer supplied with the coating forming material in a liquid or liquid slurry and a carrier gas.

17. A method according to claim 14 wherein the atomiser is a plain-jet gas blast atomiser supplied with coating forming material in the form of a powder, and a carrier gas.

18. A method according to claim 1 wherein the exciting medium includes the atomised coating forming material mixed with an inert or reactive gas.

19. A method according to claim 1 wherein the substrate to be coated is positioned with respect to the exciting medium and means for introducing the coating material such that the coating material leaves the exciting medium and continues a distance after leaving the same to apply to the substrate to form the coating thereon.

20. A method according to claim 1 wherein a multi-layered coating is formed on a substrate surface, said substrate repeatedly exposed to atomised coating forming material which has passed through an exciting medium and during the repeated exposure, the form of the atomised coating forming material is changed at least once so as to provide coating layers from at least two different forms of atomised coating forming material.

21. A method according to claim 20 wherein the composition of the precursor and/or the nature of the exciting medium are changed during the production of the coating.

22. A method according to claim 1 wherein the substrate is remote from the exciting medium in that it is physically spaced from the exciting medium by a selected distance and/or a physical obstacle.

* * * * *

UNITED STATES PATENT AND TRADEMARK OFFICE
CERTIFICATE OF CORRECTION

| | | |
|---|---|---|
| PATENT NO. | : 7,968,154 B2 | |
| APPLICATION NO. | : 10/514661 | |
| DATED | : June 28, 2011 | |
| INVENTOR(S) | : Luke John Ward | |

It is certified that error appears in the above-identified patent and that said Letters Patent is hereby corrected as shown below:

Title Page, Item (73) Assignee:
Replace "P2i Limited" in Assignee name with --Surface Innovations Limited--.

Signed and Sealed this
Twenty-second Day of November, 2011

David J. Kappos
*Director of the United States Patent and Trademark Office*